(12) United States Patent
Halstead et al.

(10) Patent No.: US 8,203,200 B2
(45) Date of Patent: Jun. 19, 2012

(54) DIODE LEADFRAME FOR SOLAR MODULE ASSEMBLY

(75) Inventors: Whitfield G. Halstead, Palo Alto, CA (US); Steven Croft, Menlo Park, CA (US); Shawn Everson, Fremont, CA (US)

(73) Assignee: Miasole, Santa Clara, CA (US)

( * ) Notice: Subject to any disclaimer, the term of this patent is extended or adjusted under 35 U.S.C. 154(b) by 107 days.

(21) Appl. No.: 12/626,281

(22) Filed: Nov. 25, 2009

(65) Prior Publication Data

US 2011/0121441 A1    May 26, 2011

(51) Int. Cl.
*H01L 23/498* (2006.01)

(52) U.S. Cl. ........ 257/676; 257/692; 257/696; 257/712; 257/773; 257/779; 257/E23.023; 257/E23.043; 257/E23.047; 257/E23.051; 257/E23.101; 257/E23.07

(58) Field of Classification Search .......... 257/666–677, 257/692, 696, 712, 773, 779, E23.023, E23.043, 257/E23.047, E23.051, E23.101, E23.07
See application file for complete search history.

(56) References Cited

U.S. PATENT DOCUMENTS

| | | |
|---|---|---|
| 4,694,117 A | 9/1987 | Friedrich et al. |
| 5,330,583 A | 7/1994 | Asai et al. |
| 5,389,159 A | 2/1995 | Kataoka et al. |
| 5,391,235 A | 2/1995 | Inoue |
| 5,457,057 A | 10/1995 | Nath et al. |
| 5,567,248 A | 10/1996 | Chung |
| 5,620,528 A | 4/1997 | Schade et al. |
| 6,058,020 A * | 5/2000 | Winterer et al. ............... 361/767 |
| 6,121,542 A | 9/2000 | Shiotsuka et al. |
| 6,144,046 A | 11/2000 | Hanoka |
| 6,208,020 B1 * | 3/2001 | Minamio et al. ............... 257/684 |
| 6,218,606 B1 | 4/2001 | Morizane |
| 6,307,755 B1 * | 10/2001 | Williams et al. ............... 361/813 |
| 6,313,396 B1 | 11/2001 | Glenn |

(Continued)

FOREIGN PATENT DOCUMENTS

EP    2345072    7/2011

(Continued)

OTHER PUBLICATIONS

U.S. Appl. No. 12/121,602, "Solar-cell module with in-laminate diodes and external-connection mechanisms mounted to respective edge regions", Croft et al., filed May 15, 2008.

(Continued)

*Primary Examiner* — Steven Loke
*Assistant Examiner* — Victoria Hall
(74) *Attorney, Agent, or Firm* — Weaver Austin Villeneuve & Sampson LLP

(57) ABSTRACT

A leadframe design for a diode or other semiconductor device that reduces stress on the device and provides increased heat dissipation is provided. According to various embodiments, the leadframe has a contoured profile including a recessed area and a raised surface within the recessed area. The surface supports the device such that the edges of the device extend past the surface. Also provided are device assemblies including the novel leadframes. In certain embodiments, the assemblies include one or more leadframes attached via a solder joint to a device. According to various embodiments, the leadframes are attached to the front side of the device, back side of the device or both. In particular embodiments, the device is a bypass diode for one or more solar cells in a solar module.

19 Claims, 11 Drawing Sheets

U.S. PATENT DOCUMENTS

| | | | |
|---|---|---|---|
| 6,388,336 B1 * | 5/2002 | Venkateshwaran et al. | 257/779 |
| 6,728,097 B2 * | 4/2004 | Wada et al. | 361/533 |
| 7,563,647 B2 * | 7/2009 | Bathan et al. | 438/122 |
| 7,675,148 B2 * | 3/2010 | Lim et al. | 257/676 |
| 7,901,996 B2 * | 3/2011 | Bathan et al. | 438/123 |
| 7,906,837 B2 * | 3/2011 | Cabahug et al. | 257/676 |
| 2005/0133083 A1 | 6/2005 | Matsushita et al. | |
| 2005/0156296 A1 * | 7/2005 | Wang et al. | 257/673 |
| 2007/0052076 A1 * | 3/2007 | Ramos et al. | 257/676 |
| 2007/0132073 A1 * | 6/2007 | Tiong et al. | 257/666 |
| 2007/0283996 A1 | 12/2007 | Hatchmann et al. | |
| 2007/0283997 A1 * | 12/2007 | Hachtmann et al. | 136/244 |
| 2008/0044946 A1 * | 2/2008 | Cruz et al. | 438/107 |
| 2008/0135990 A1 * | 6/2008 | Coyle et al. | 257/666 |
| 2008/0203549 A1 * | 8/2008 | Chow et al. | 257/673 |
| 2009/0283137 A1 | 11/2009 | Croft et al. | |
| 2010/0108122 A1 * | 5/2010 | Everson et al. | 136/246 |
| 2010/0193922 A1 * | 8/2010 | Kastner et al. | 257/676 |
| 2011/0074007 A1 * | 3/2011 | Lopez et al. | 257/692 |
| 2011/0146778 A1 | 6/2011 | Croft et al. | |
| 2011/0192448 A1 | 8/2011 | Croft et al. | |

FOREIGN PATENT DOCUMENTS

| | | |
|---|---|---|
| JP | 06-252333 | 9/1994 |
| JP | 07-302923 | 11/1995 |
| JP | 2000-216421 | 8/2000 |
| JP | 2000-277785 | 10/2000 |
| JP | 2001-298134 | 10/2001 |
| JP | 2001-339087 | 12/2001 |
| JP | 2002-026195 | 1/2002 |
| JP | 2002-151554 | 5/2002 |
| JP | 2002-158324 | 5/2002 |
| JP | 2003-110077 | 4/2003 |
| JP | 2003-197828 | 7/2003 |
| WO | 2009/140521 | 11/2009 |
| WO | 2010/053730 | 5/2010 |
| WO | 2011/066178 | 6/2011 |
| WO | 2011/087749 | 7/2011 |

OTHER PUBLICATIONS

U.S. Appl. No. 12/121,602, Office Action mailed Mar. 26, 2010.
U.S. Appl. No. 12/264,712, "Combined diode, lead assembly incorporating an expansion unit", Everson et al., filed Nov. 4, 2008.
U.S. Appl. No. 12/644,324, "Diode rail system for photovoltaic modules", Andrew J. Zeiner, filed Dec. 22, 2009.
U.S. Appl. No. 12/644,360, "Shielding of interior diode assemblies from compression forces in thin-film photovoltaic modules", Croft et al., filed Dec. 22, 2009.
WO patent application No. PCT/US2009/043989, International Search Report and Written Opinion mailed Dec. 2, 2009.
WO patent application No. PCT/US2009/062016, International Search Report and Written Opinion mailed May 20, 2010.
U.S. Appl. No. 12/121,602, Office Action mailed Aug. 6, 2010.
U.S. Appl. No. 12/121,602, Advisory Action mailed Sep. 29, 2010.
U.S. Appl. No. 12/121,602, Examiner Interview Summary mailed Oct. 14, 2010.
U.S. Appl. No. 12/264,712, Office Action mailed Jul. 28, 2011.
International Preliminary Report on Patentability mailed Nov. 25, 2010, issued in PCT Application No. PCT/US2009/043989.
International Preliminary Report on Patentability mailed May 19, 2011, issued in PCT Application No. PCT/US2009/062016.
International Search Report and Written Opinion mailed Jul. 29, 2011, from PCT Application No. PCT/US2010/057327.

* cited by examiner

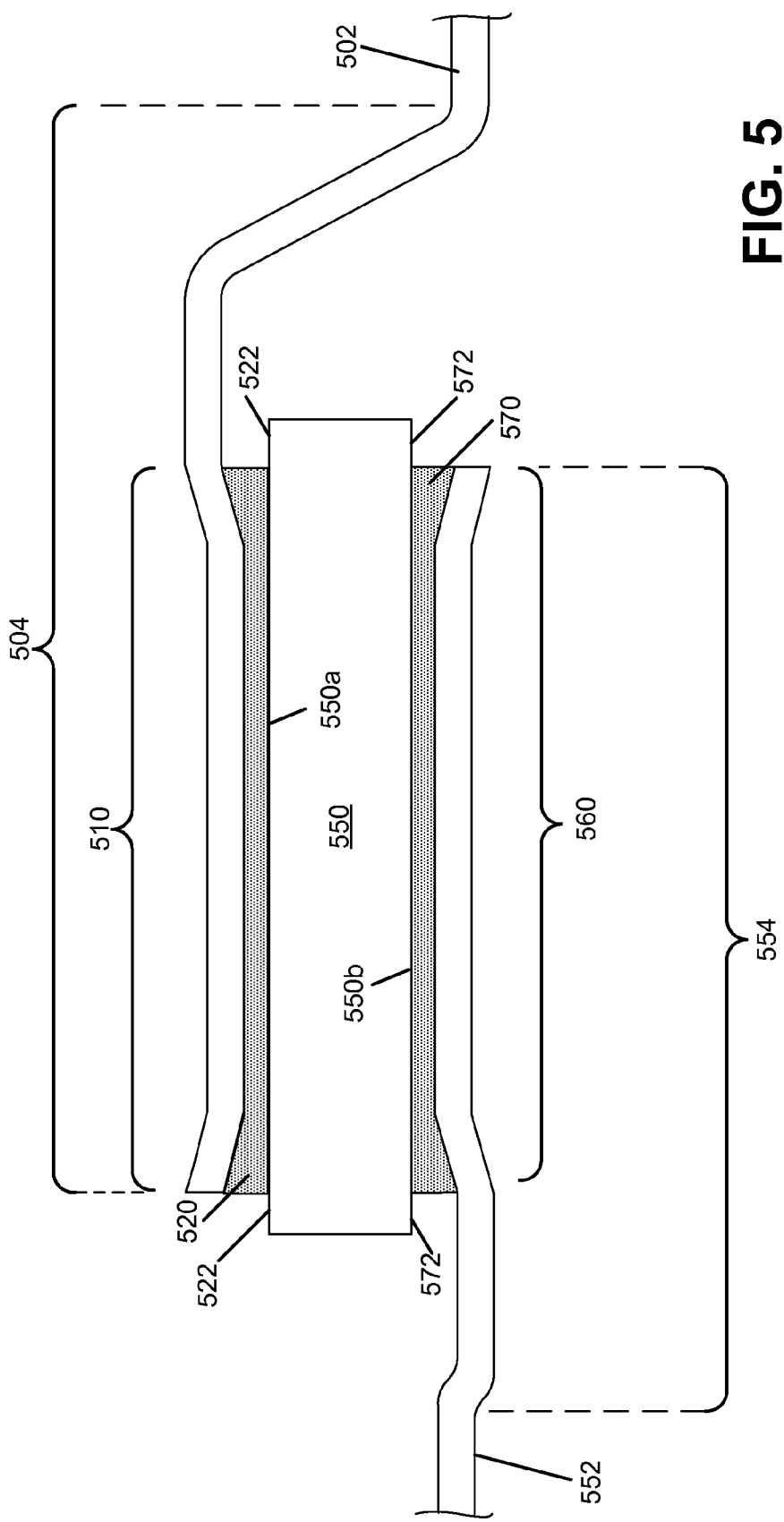

US 8,203,200 B2

DIODE LEADFRAME FOR SOLAR MODULE ASSEMBLY

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. Collecting current from solar cells, solar cell modules and solar cell arrays without power loss in a highly reliable manner is important to the viability of solar energy as a cheap, renewable source of clean energy. The use of bypass diodes to overcome the impact of shunt defects that cause power loss in solar cells improves reliable energy transfer.

SUMMARY OF THE INVENTION

A leadframe design for a diode or other semiconductor device that reduces stress on the device and provides increased heat dissipation is provided. According to various embodiments, the leadframe has a contoured profile including a recessed area and a raised surface within the recessed area. The surface supports the device such that the edges of the device extend past the surface. Also provided are device assemblies including the novel leadframes. In certain embodiments, the assemblies include one or more leadframes attached via a solder joint to a device. According to various embodiments, the leadframes are attached to the front side of the device, back side of the device or both. In particular embodiments, the device is a bypass diode for one or more solar cells in a solar module.

One aspect of the invention relates to a contoured leadframe for a semiconductor device, including a first portion including a raised surface and a recessed surface adjoining at least a portion of the raised surface; and a second portion adjoined to the first portion and comprising a first surface vertically offset from the recessed surface. The first portion may also be referred to herein as a recessed portion, and the second portion as a main portion. According to various embodiments, the raised surface is configured to support the semiconductor device. The raised surface may have an area smaller than that of the supported surface of the semiconductor device, such that the edges of the device surface overhang the raised surface. In certain embodiments, the first surface is vertically offset from the raised surface. The second portion may be adjoined to the first portion at a plurality of sides of the first portion. The recessed surface may be adjoined to a plurality of sides of the raised surface.

Another aspect of the invention relates to semiconductor device leadframe assembly including a contoured leadframe and a semiconductor device attached via a solder joint to a raised surface of the leadframe, such that at least one edge of the device extends past the solder joint. According to various embodiments, the leadframe includes a first portion including a raised surface and a recessed surface adjoining the raised surface and a second portion adjoined to the first portion and including a first surface vertically offset from the recessed surface. According to various embodiments, the backside or the front side of the semiconductor device may be attached to the raised surface. In certain embodiments, all of the edges of the device extend past the solder joint. The assembly may also include a second leadframe attached via a solder joint to the device, with the second leadframe including a third portion having a raised surface and a recessed surface adjoining the raised surface and a fourth portion adjoined to the third portion and including a second surface vertically offset from the recessed surface of the third portion. According to various embodiments, the device is a bypass diode for a solar module assembly.

Also provided are solar module assemblies including the leadframes and leadframe assemblies, and methods of fabricating the leadframes and assemblies. These and other aspects of the invention are described further below with reference to the figures.

BRIEF DESCRIPTION OF THE DRAWINGS

FIG. 5 is a cross-sectional view of a device and leadframe assembly in accordance with an embodiment of the present invention.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while the description below refers chiefly to leadframes for bypass diodes used in solar modules, the leadframes and assemblies described herein may be used with other discrete or complex semiconductor devices. One of skill in the art will understand from the description presented herein how to implement the inventive leadframes and assemblies and related methods described herein with other types of devices and assemblies, e.g., transistors, diodes, DC/DC converters, inverters, etc. In certain embodiments, the invention may also be implemented for any type of die. Also, in the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1A:
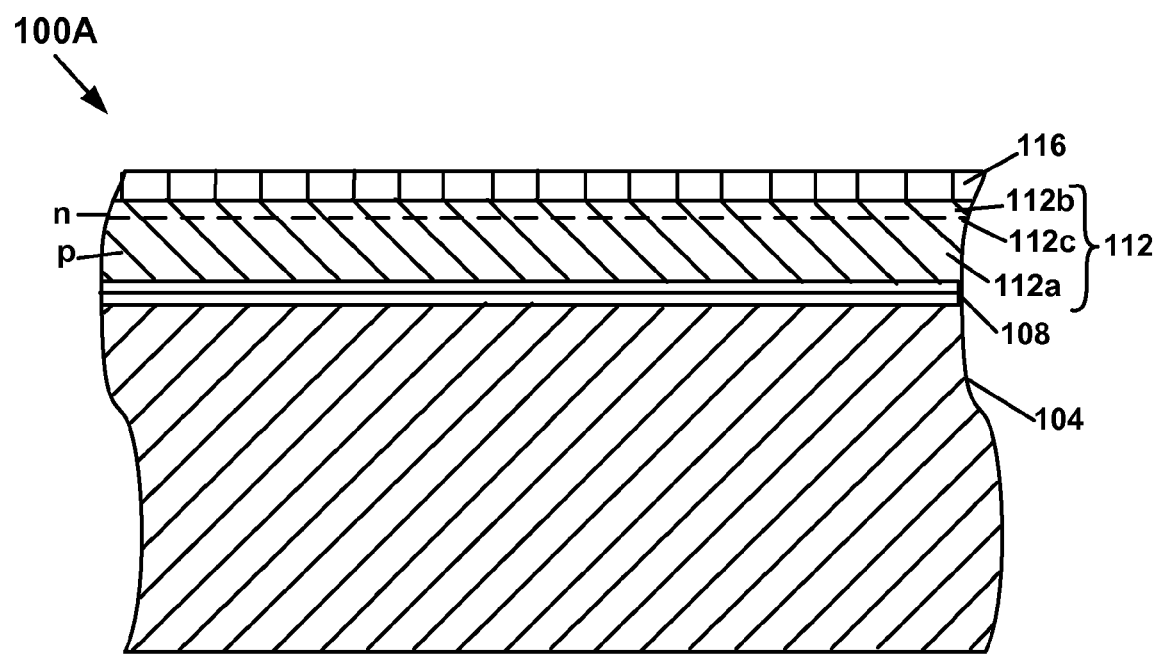
FIG. 1A shows a cross-sectional elevation view of a layer structure of a solar cell, in accordance with an embodiment of the present invention.
Figure 1B:
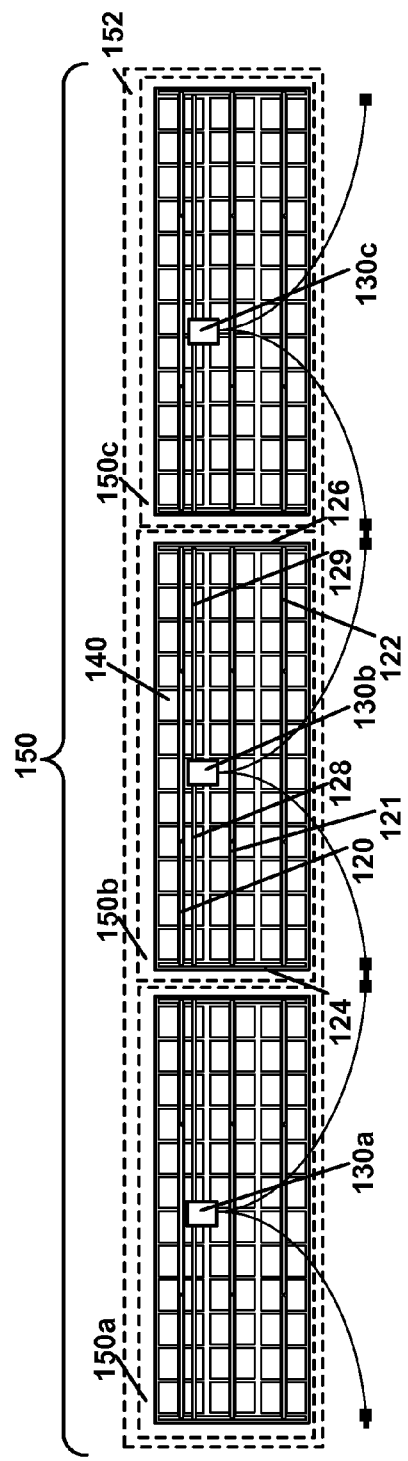
FIG. 1B shows a plan view of a solar-cell array including a plurality of solar-cell modules and diode assemblies in accordance with an embodiment of the present invention

As indicated above, embodiments of the invention relate to leadframes and soldering processes for bypass diodes in solar modules. FIGS. 1A and 1B illustrate examples of a solar cell and solar panel assembly. With reference to FIG. 1A, in accordance with an embodiment of the present invention, a cross-sectional view of a layer structure of a solar cell 100A is shown. The solar cell 100A includes a metallic substrate 104 and an absorber layer 112 is disposed over the metallic substrate 104. Any suitable semiconductor materials, such as CIGS, CIS, CdTe, CdS, ZnS, ZnO, amorphous silicon, polycrystalline silicon, etc. may be used as the absorber layer 112. As shown, the absorber layer 112 includes a p-type portion 112a and an n-type portion 112b. As a result, a pn homojunction 112c is produced in the absorber layer 112 that serves to separate charge carriers that are created by light incident on the absorber layer 112. According to various embodiments, the pn junction may be any type of pn junction, including. e.g., a homojunction in a single semiconductor material or a heterojunction between two different semiconductor materials.

On the surface of the n-type portion 112b of the absorber layer 112 is one or more transparent electrically conductive oxide (TCO) layers 116 to collect current from the absorber layer 112 fix conduction to an external load. Examples of materials in TCO layer 116 include zinc oxide, ZnO, and a doped conductive oxide, such as aluminum zinc oxide (AZO) or indium tin oxide (ITO). A conductive backing layer 108 is disposed between the absorber layer 112 and the metallic substrate 104. Conductive backing layer 108 may be made of any appropriate material, e.g., molybdenum, niobium, copper, silver, etc.

FIG. 1B is a plan view of a solar module array 152 including a plurality 150 of solar-cell modules 150a, 150b and 150c, each including a set of interconnected solar cells 140 arranged in three rows. A solar module according to certain embodiments also includes one or more diodes connected to one or more cells of the module such that the diode will conduct electrical current if the cell(s) become damaged or shaded. For example in FIG. 1B, each module includes a plurality of diodes, depicted as first, second and third diode assemblies 120, 121 and 122 (shown only for solar-cell module 110b). Each assembly 120, 121 and 122 is aligned with a row of cells and containing a plurality of diodes (not shown), with each diode used to bypass current around a single cell. As discussed below with reference to FIGS. 2A-2D, a diode may be used to bypass current for one or more cells arranged in various electrical connection configurations. In certain embodiments, a single bypass diode may be used for a module.

The depicted modules include centrally-mounted junction boxes, 130a, 130b and 130c, though in other embodiments, the junction boxes may be mounted elsewhere and/or external connection boxes may be used. Busbars may be used for current collection; in FIG. 1B, a first busbar 124 and a terminating busbar 126 are each electrically coupled with the first, second and third diode assemblies 120, 121 and 122. Busbars 128 and 129 provide additional wiring to junction box 130b to collect current. Each junction box has two cables or connectors attached to it, each configured to form an interconnector with another module. The solar panel array may be mounted on a roof or other surface to absorb solar energy and convert it to electricity. In certain embodiments, module components include cells, diodes and busbars are protected by a laminate.

Figure 2A:
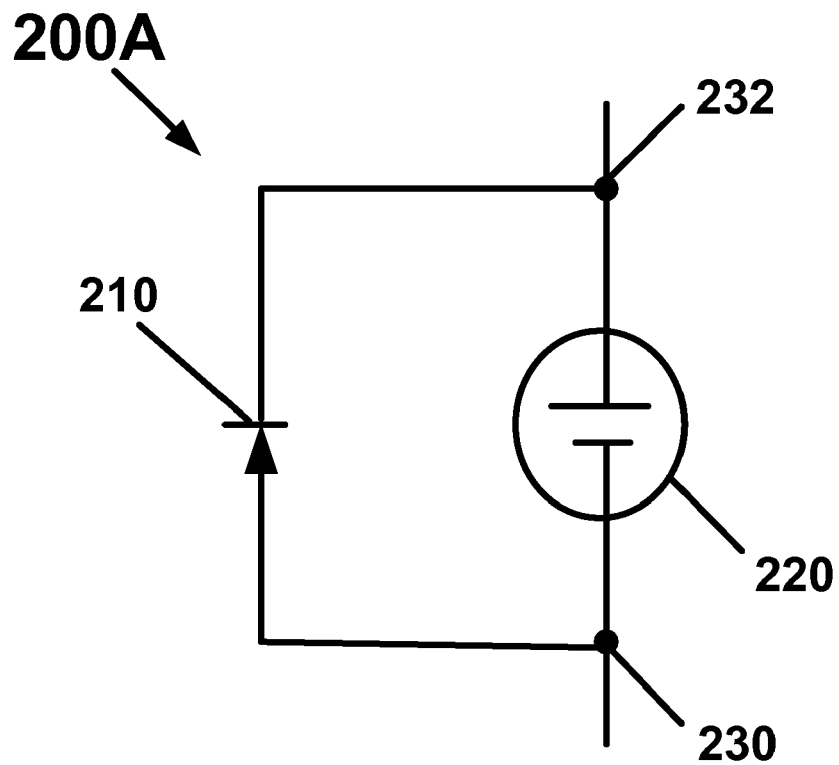
FIG. 2A is a schematic diagram of a diode used to bypass current around a solar cell and electrically coupled in parallel with the solar cell, in accordance with an embodiment of the present invention.
Figure 2B:
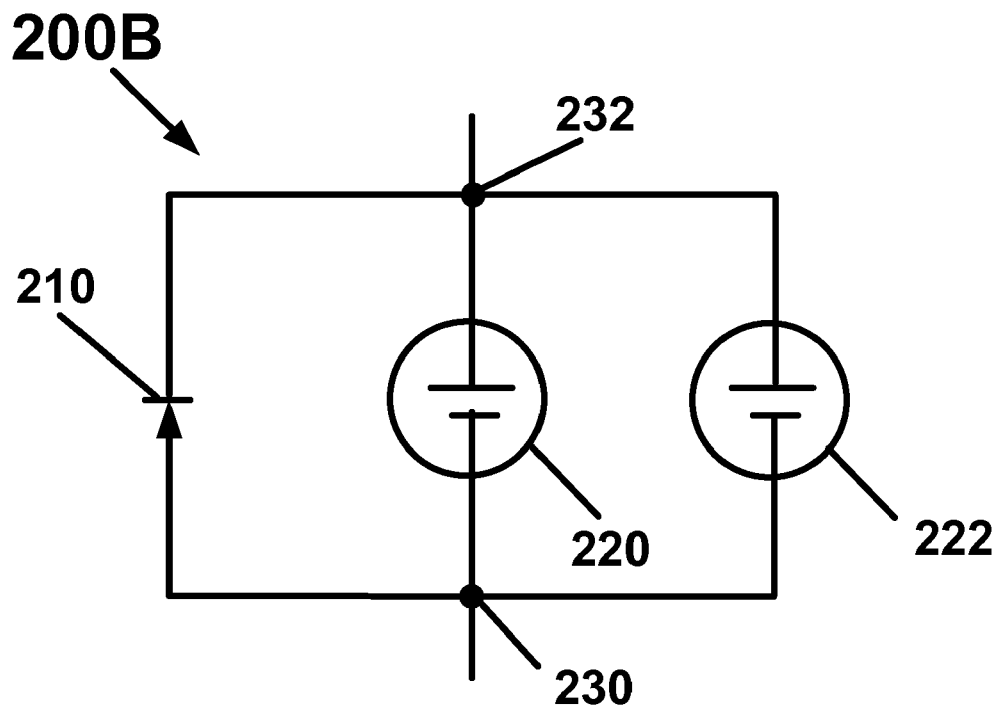
FIG. 2B is a schematic diagram of a diode used to bypass current around a plurality of solar cells and electrically coupled in parallel with the plurality of solar cells that are electrically coupled in parallel, in accordance with an embodiment of the present invention.
Figure 2C:
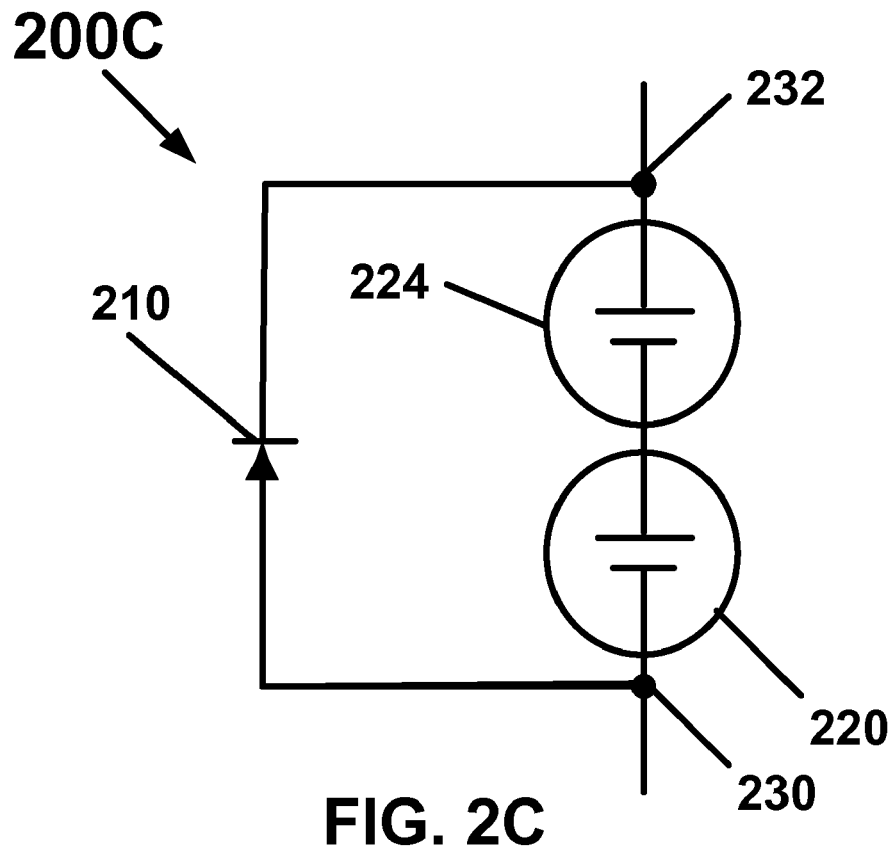
FIG. 2C is a schematic diagram of a diode used to bypass current around a plurality of solar cells and electrically coupled in parallel with the plurality of solar cells that are electrically coupled in series, in accordance with an embodiment of the present invention.
Figure 2D:
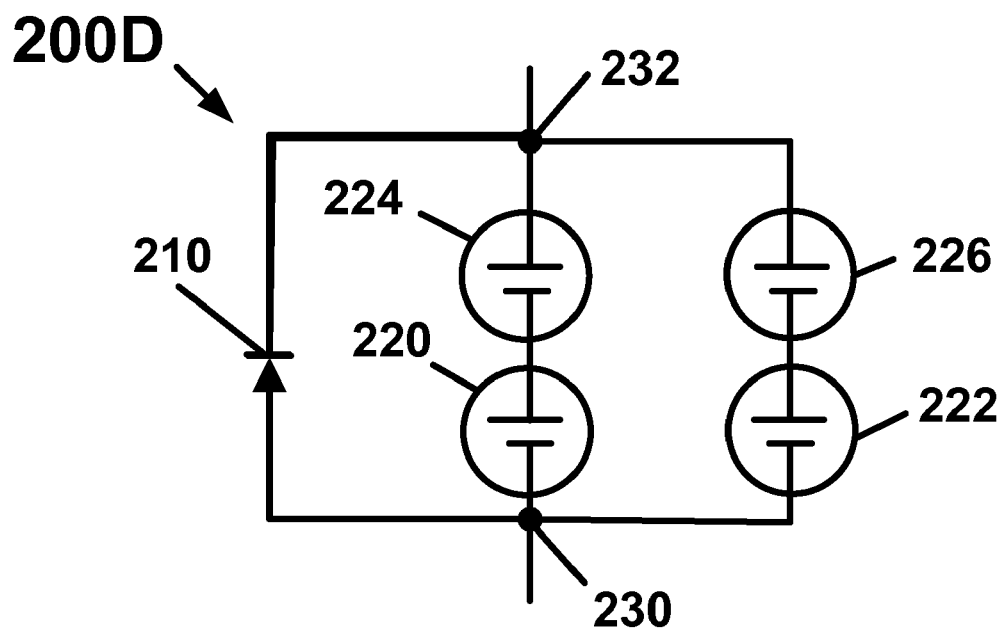
FIG. 2D is a schematic diagram of a diode used to bypass current around a plurality of solar cells and electrically coupled in parallel with the plurality of solar cells that are electrically coupled in series and in parallel, in accordance with an embodiment of the present invention.

With reference now to FIGS. 2A-2D, several embodiments of the present invention are shown that illustrate examples of the manner in which a diode may be electrically coupled with at least one or a plurality of solar cells. FIG. 2A shows a schematic diagram 200A of a diode 210 used to bypass current around a solar cell 220 and electrically coupled in parallel with one solar cell 220 at a first terminal 232 and at a second terminal 230. To bypass current around the solar cell 220 in an event that the solar cell 220 develops a high resistance to the passage of solar-cell module current, the diode 210 is coupled to solar cell 220 with reverse polarity to that of the solar cell 220. FIG. 2B shows a schematic diagram 200B of the diode 210 used to bypass current around a plurality of solar cells 220 and 222 that are electrically coupled in parallel. The diode 210 is electrically coupled in parallel to the combination of solar cell 220 and a parallel solar cell 222 at first terminal 232 and at second terminal 230. FIG. 2C shows a schematic diagram 200C of the diode 210 used to bypass current around a plurality of solar cells 220 and 224 that are electrically coupled in series. The diode 210 is electrically coupled in parallel to the combination of solar cell 220 and solar cell 224 at first terminal 232 and at second terminal 230. To bypass current around the series combination of solar cells 220 and 224 in an event that at least one of the solar cells 220 or 224 develops a high resistance to the passage of solar-cell module current, the diode 210 is coupled to the solar cells 220 and 224 with reverse polarity to both of these solar cells. In another example, FIG. 2D shows a schematic diagram 200D of a diode used to bypass current around a plurality of solar cells and electrically coupled in parallel with the plurality of solar cells that are electrically coupled in series and in parallel. The diode 210 is electrically coupled in parallel to the combination of solar cell 220 and solar cell 224 coupled in series with solar cell 220 and the combination of solar cell 222 and solar cell 226 coupled in series with solar cell 222. The diode 210 is electrically coupled with the series/parallel combination of solar cells 220, 224, 222 and 226 at first terminal 232 and at second terminal 230. To bypass current around the series/parallel combination of solar cells 220, 224, 222 and 226 in an event that at least one of the solar cells 220, 224, 222 and 226 develops a high resistance to the passage of solar-cell module current, the diode 210 is coupled to the solar cells 220, 224, 222 and 226 with reverse polarity to these solar cells. In accordance with embodiments of the present invention, a bypass diode may located to bypass current from a single solar cell or a plurality of solar cells including a parallel combination of any number of solar cells, a series combination of any number of solar cells and a series/parallel combination of any number solar cells. Embodiments of the present invention include a diode electrically coupled in parallel with any network that includes a configuration of interconnected solar cells, in which the diode serves to bypass current around the network in an event the network, or alternatively a solar cell within the network, develops high resistance to the flow of current through the solar-cell module. According to various embodiments, the bypass diode may be within a solar module laminate, in a junction or connection box, or in any other position.

In solar modules, diode reliability and yield can be critical to overall performance of the module. Replacement of a diode can be difficult or impossible especially if the diode is encapsulated in a laminate material protecting the module. Moreover, stresses induced in the diode can lead to diode failure and loss of yield. The leadframes and assemblies presented herein provide reduced stress and increased heat dissipation, resulting in improved reliability and yield.

While embodiments of the invention relate to bypass diodes for solar cell assemblies, as discussed above with respect to FIGS. 1A-2D, the leadframes and assemblies may be employed with any discrete device die, including but not limited to any type of transistor die and diode die. According to various embodiments, front side (active side) and back side (inactive side) leadframes are provided for devices having two major faces. For a Schottky diode, the front side is the anode side and the back side the cathode side. In many discrete devices the front side is not soldered, but contacted by wire bonding. In certain embodiments, both front side and back side solderable leadframes are provided, as are device assemblies including solder joints to both front and back sides.

Figure 3:
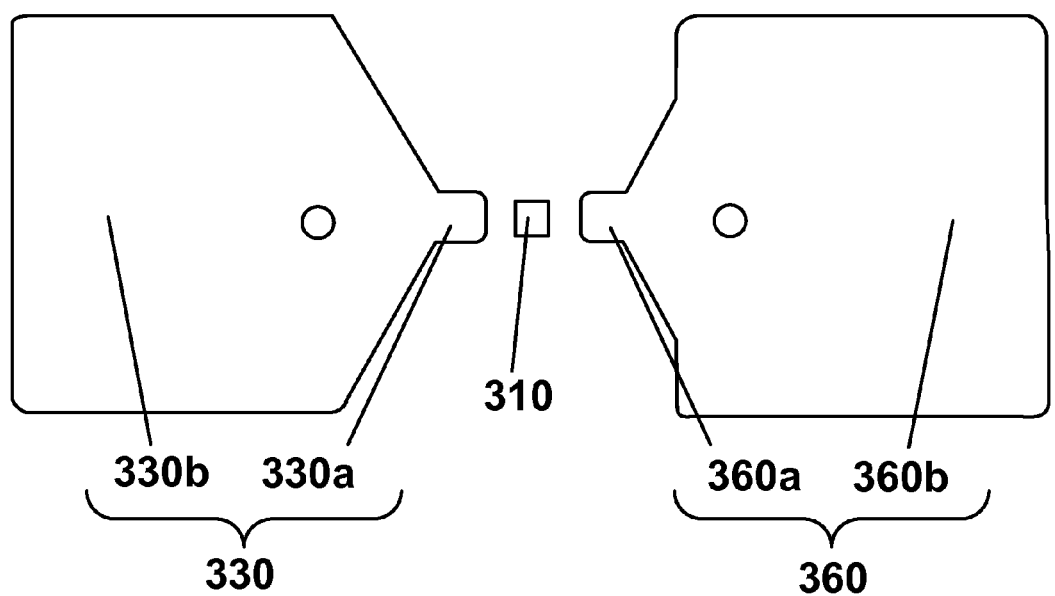
FIG. 3 is a top expanded view of a combined diode and lead assembly showing component parts of the assembly including a diode, a first leadframe and a second leadframe in accordance with an embodiment of the present invention.

FIG. 3 shows a top view of anode side and cathode side leadframe designs for a diode (die 310) according to an embodiment of the invention. Die 310 has two major surfaces with one major surface shown in the FIG. 3. Once assembled, a major surface is joined to the appropriate leadframe via a solder or other joint. The die facing surfaces of cathode side leadframe 330 and anode side leadframe 360 are shown. Cathode side leadframe 330 includes two portions: a main portion 330*b* and a recessed or pocket portion 330*a*. Similarly anode side leadframe 360 includes a main portion 360*b* and a recessed portion 360*a*. As is explained further below with respect to FIGS. 4A and 4B, a raised surface (not shown) within each recessed portion provides support for the die. Each raised surface is smaller than the surface area of the die 310 surface it faces. The die-facing surface of each of recessed areas 330*a* and 360*a*, including the raised surface and the area of the recessed surface that adjoins the raised surface, is larger than the surface area of the die 310 surface it faces.

Overheating can lead to device failure or yield loss. The main portions 330*b* and 360*b* of each leadframe provide an avenue for heat dissipation, and are substantially larger than the recessed portions 330*a* and 360*a*. In the example shown in FIG. 3, the main portions 330*b* and 360*b* each contact their respective recessed portions 330*a* and 360*a* on three of the four circumferential sides of the recessed portions to aid in dissipating heat. The "bow-tie" design of the die and leadframes formed with the main portions 330*b* and 360*b* angled away from the recessed portions 330*a* and 360*a*, respectively, allow for nearly all of the 360° surrounding the die to dissipate heat. Bow-tie diode and leadframe assemblies are also described in commonly-assigned U.S. patent Ser. No. 12/264, 712, filed on Nov. 4, 2008 and entitled "Combined Diode, Lead Assembly Incorporating an Expansion Joint," which is incorporated by reference herein. For ease of description, various features and details of the leadframe assemblies have been omitted here. In certain embodiments, the leadframes described may incorporate features described in the referenced patent application, including an expansion joint.

The main portion of the leadframe is generally substantially planar, though main portions having recessed or raised features are within certain embodiments of the claims. The recessed portion is recessed with respect to the main portion, that is when the die-facing side of the leadframe is viewed, the recessed portion is concave to the main portion. Within the recessed portion is a raised pad. The recessed portion generally includes a substantially planar area adjoined to at least part of the periphery of the raised pad. The recessed portion may also include sloped or vertically-oriented sidewalls that connect the planar area of the recessed portion to the main portion. The raised pad is raised with respect to the recessed surfaced (the planar surface of the recessed portion), that is when the die-facing side of the leadframe is viewed, the raised pad is convex to the recessed surface that adjoins the raised pad. The raised pad generally includes a planar surface to support the die and may also include sloped or vertical sidewalls that connect the raised planar surface to the recessed surface. The raised surface is generally the same shape as the die, e.g., square or rectangular, though with a smaller area such that the edges of the die extend past the edges of the raised surface, and in certain embodiments, past the sidewalls of the raised pad. In certain embodiments, the raised surface may have a different shape than the die, e.g., if it desired that different areas of the die have different edge exclusion distances. The recessed portion may also follow the same general shape as the die and/or raised pad, or a portion thereof, or it may take a different shape. The main portion may be any appropriate shape, e.g., elongated, generally rectangular, etc. Although various portions or areas of the leadframe have been described as substantially flat or planar, in certain embodiments they may additionally have one or more raised or recessed features.

According to certain embodiments, portions of at least two of the circumferential sides of the raised pad are in contact with the remaining (non-raised) are of the recessed portion. This aids in dissipating heat from the die. In certain embodiments, portions of at least three sides of the raised pad are in contact with the remaining area of the recessed portion of the leadframe. An example of this is shown below in FIGS. 4A and 4B where all or a portion of three of the four circumferential sides of the raised pad contact the rest of the recessed portion. Also in certain embodiments, portions of four or more or all sides of the raised pad are in contact the remaining area of the recessed area. In certain embodiments, at least about 30%, 40%, 50% or 60% of the circumference of the raised pad contacts the non-raised area of the recessed portion. The invention is not necessarily limited to these embodiments; for example only one side of the raised pad may contact the rest of the recessed portion.

Also according to certain embodiments, portions of at least two sides of the circumferential sides of the recessed portion are in contact with the main portion. In certain embodiments, portions of at least three sides of the circumferential sides of the recessed portion are in contact with the main portion. An example of this is shown below in FIGS. 4A and 4B where all or a portion of three sides of the recessed portion are in contact with the main portion of the depicted leadframes. In certain embodiments, all of the circumferential sides of the recessed portion contact the main portion. The invention is not necessarily limited to these embodiments; for example only one side of the recessed portion may contact the main portion.

Figure 4A:
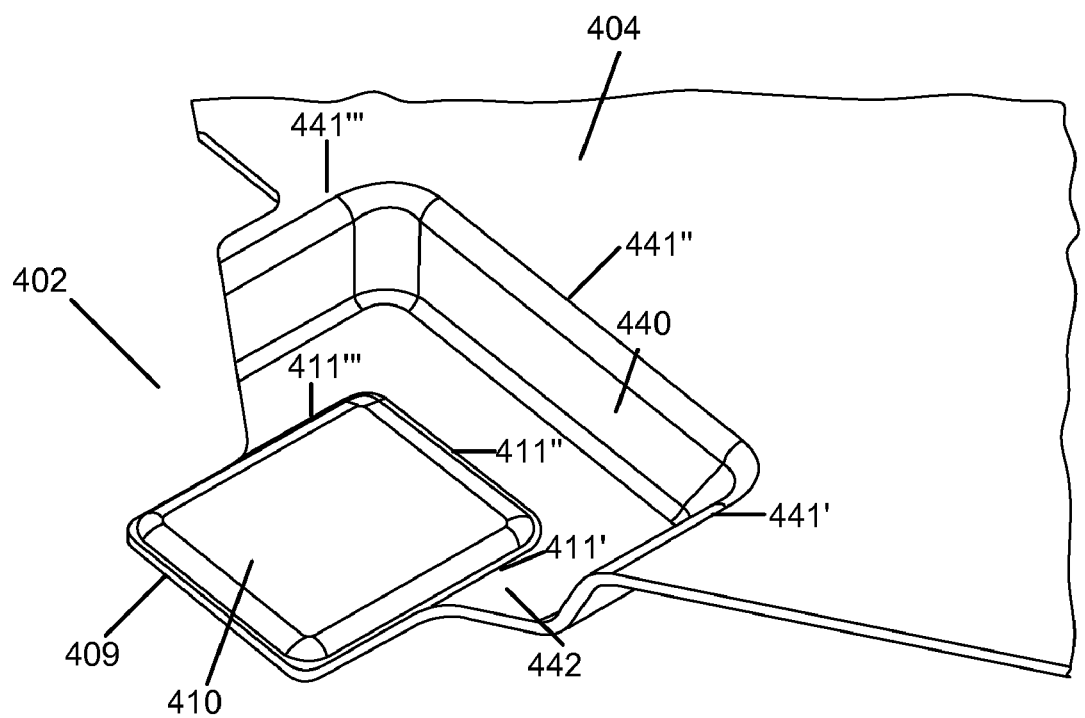
FIGS. 4A and 4B are perspective views of cathode and anode leadframe designs for a diode in accordance with an embodiment of the present invention.
Figure 4B:
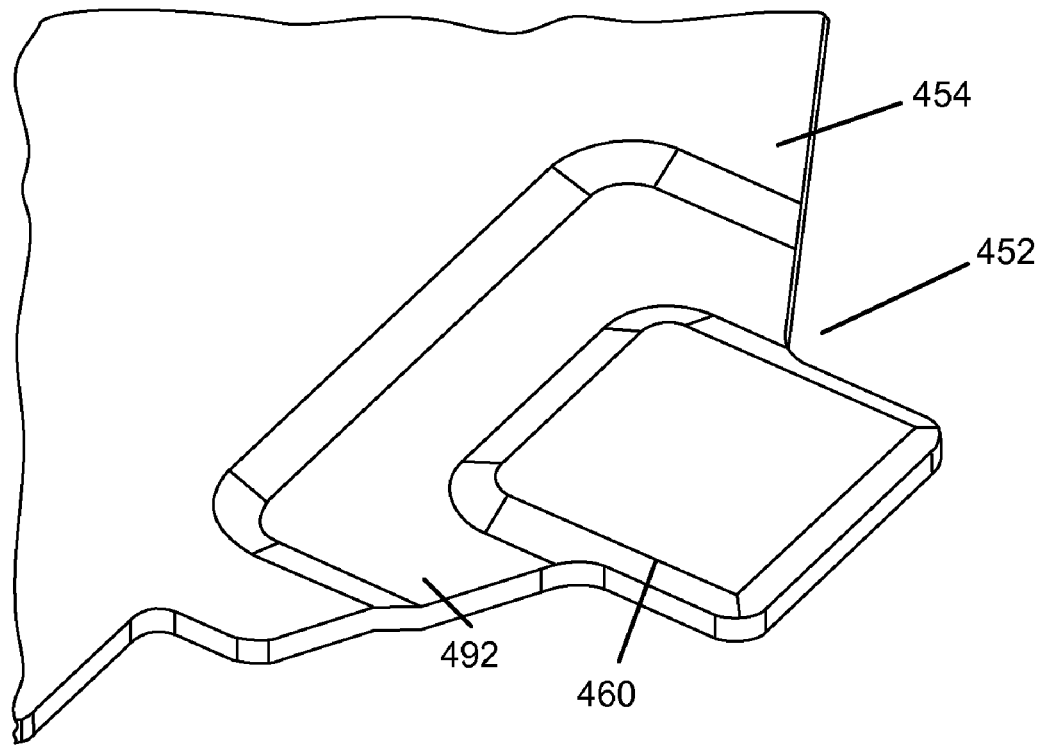

As indicated above, a raised surface within the recessed portion supports the die. FIGS. 4A and 4B show examples of this feature in cathode and anode side leadframe designs for a bow-tie assembly. First, in FIG. 4A, a portion of a cathode or back side leadframe is depicted, including recessed portion 402 and part of main portion 404. Within the recessed portion 402 is a raised pad 409 including raised die supporting surface 410. During fabrication of the packaged device, the die is precisely aligned over the raised surface 410 such that the edges of the die extend past the raised surface and the solder joint between the leadframe and the die is confined to a region inside the edges of the die. As indicated above, the recessed area is larger than that of the die such that the die clears the sidewalls 440 of the recessed portion 402. The main portion 404 contacts the recessed portion 402 on three of its four circumferential sides as indicated at 441', 441" and 441'''. The area 442 adjoins the raised surface 410 (via the sidewalls of raised pad 409) on three of its four circumferential sides as indicated at 411', 411" and 411''' providing a large area for heat dissipation as well as mechanical support.

FIG. 4B shows an example of a portion of an anode or front side leadframe, including recessed portion 452 and part of main portion 454. Similar to the back side leadframe depicted in FIG. 4A, the front side lead frame includes both a raised surface 460 and a recessed surface 492 within recessed portion 452 to which the front side of the device can be soldered. Also as in FIG. 4A, the area of the raised surface 460 is smaller than that of the die surface to which it is to be soldered, to prevent the solder joint from contacting the edge of the device. In embodiments wherein the leadframe assembly includes both backside and front side leadframes as depicted in FIGS. 4A and 4B, the raised surfaces may have the same surface area, may be differently sized, e.g., to allow different edge exclusion areas (the amount of the die that extends past the solder joint) for the back and front sides.

The designs described above allow for improved heat transfer and minimize stress in the die, thereby improving device reliability. As indicated above, in many devices, the front side of the die is contacted only via wire bonding and not soldering, which does not allow heat transfer from that side of the device. Devices that are soldered on the back side suffer from reliability degradation or yield loss due to cracks propagated by stresses induced by the soldering process. The edge of the die is the area where these cracks are most likely to initiate, due to residual damage from the dicing process. Stresses are primarily induced by shrinkage in the solder and in the copper lead frame that occurs in the cooling process after the solder solidifies. In order to achieve heat transfer out of the die, with the back side lead frame serving as a heat sink to remove the heat produced by the device in operation, the back side solder joint covers a large portion of the back surface of the die. The above-described shrinkage issue is especially problematic with lead-free solder joints due to high yield strength. The leadframe assemblies described herein may have lead-free solder joints in certain embodiments.

The leadframe designs and processes presented herein confine the solder joint to a region inside the edges of the die, reducing the stress induced in the die. As discussed above, a leadframe according to certain embodiments has a raised surface smaller than the size of the die. Surface tension retains the solder on the raised surface, preventing the solder from reaching the edge of the die. Alignment of parts is controlled throughout the soldering process, such that the solder is not allowed to reach the edges of the die, yet the solder joint covers the majority of the surface of the die. As indicated above, the leadframe design and soldering process may be used for solder joints to the front side of the device as well, increasing heat transfer from the device.

FIG. 5 shows a cross-sectional view of a device and leadframe assembly including front and back side leadframe designs as depicted in FIGS. 4A and 4B. Device 550 is depicted including cathode (back) side 550a and anode (front) side 550b. A portion of cathode side leadframe, including part of main portion 502 and recessed portion 504, is depicted. Recessed portion 504 includes raised pad 510. The cathode side leadframe and the cathode side 550a of device 550 are joined via solder joint 520. Edges 522 of the cathode side 550a do not contact the solder joint 520, extending past the solder joint 520 and raised pad 510.

Similarly, anode side lead frame includes main portion 552 and recessed portion 554, which itself includes a raised pad 560. A solder joint 570 joins raised pad 560 and the anode side 550b of the device 550. As with the cathode side, edges 572 of the anode side 550b extend past solder joint 570 and raised pad 560, such that none of the edges 572 contact the solder joint 570.

Raised pads 510 and 560 have a substantially flat or planar portion (the majority of the pad) that is parallel to the device, as well as angled sidewalls. Solder joints 520 and 570 are depicted as contacting the sidewalls as well as the planar portions of pads 510 and 560, respectively. In certain embodiments, the solder joint may contact only the planar portion, or the planar portion and only a portion of the sidewalls.

Figure 6A:
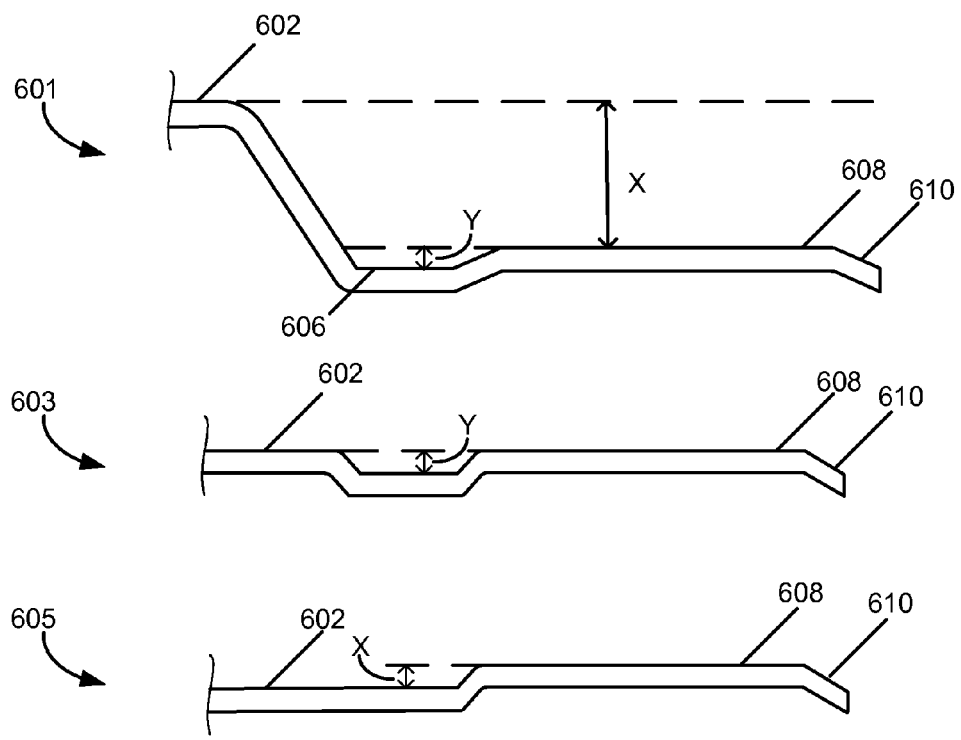
FIG. 6A depicts cross-sectional views of leadframes in accordance with various embodiments of the invention.

The main portions 502 and 552 of the cathode and anode side leadframes depicted in FIG. 5 are substantially in the same plane parallel to the diode, i.e., with the vertical offset between the main portion 502 and the recessed portion 504 of the cathode-side leadframe greater than the diode thickness. This provides substantially flat and co-planar surfaces on the anode side of the device. FIG. 6A provides examples of contoured profiles of leadframe designs according to various embodiments. First, at 601, a cross-sectional profile of a leadframe such as the cathode side leadframe depicted in FIGS. 4A and 5 is shown. The top surface of main portion 602 and flat raised surface 608 are substantially parallel surfaces that are vertically offset by a distance "X." (The device facing surface is referred to as the top surface). "X" can be any appropriate distance. In certain embodiments, this is distance is greater than the thickness of the device, and may be greater than the thickness of the device plus one or two solder joints. The area of the recessed portion of the leadframe that adjoins the pad has a surface 606 that is offset from raised surface 608 by a distance "Y." Y is the height of the raised pad and is generally large enough such that the solder joint is restricted between the raised pad and the device during soldering. For example, the raised pad may have a height of about 0.003-0.005 inches, though other distances may be used as appropriate, e.g., 0.001 inches. The distance between recessed surface 606 and main portion surface 602 is X+Y in this example. In other embodiments, the Y may be greater than X, with the raised pad in a plane above the main portion surface and with the distance between the recessed surface and the main portion Y−X. Various other arrangements are possible, with the raised portion offset from a recessed portion and/or a main portion. At 603, a contoured profile according to another example is shown. Here, there is no vertical offset between the top surface of main portion 602 and raised flat surface 608. At 605, an example is shown in which there is no recessed area, i.e., the raised portion 610 protrudes from main portion 602. The top surface of the main portion 602 is vertically offset from the top surface 608 of the raised portion 610 by a distance "X," though unlike the design shown in view 601, the raised portion is higher than the main portion 602.

The leadframe assemblies according to various embodiments may contain one or more of the leadframes described.

Figure 6B:
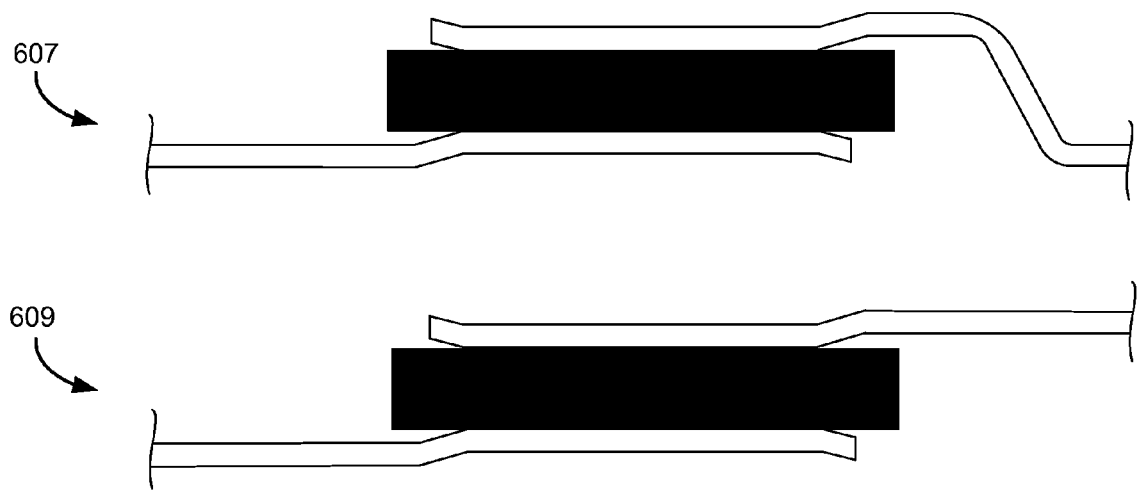
FIG. 6B depicts cross-sectional views of device and leadframe assemblies in accordance with various embodiments of the invention.

As discussed above, in certain embodiments, the assemblies include front side and back side leadframes connected via solder joints to the device. In other embodiments, only one leadframe is soldered to the device, e.g., to the back side. The other side of the device may be contacted via a wire bond or type of joint or bond to a leadframe as described above or to another type of frame. In embodiments in which there are two leadframes having contoured profiles, the leadframes may have the same or different profiles. FIG. 6B shows examples of assemblies according to various embodiments. At 607, an assembly including one leadframe as depicted at 601, and a leadframe as depicted at 605 is shown. The leadframes are joined to their respective sides of the device via solder joints (not shown). At 609, an assembly including two leadframes as depicted at 605 is shown. The leadframes are joined to their respective sides of the device via solder joints (not shown). Various other combinations may be used as appropriate.

Figure 7A:
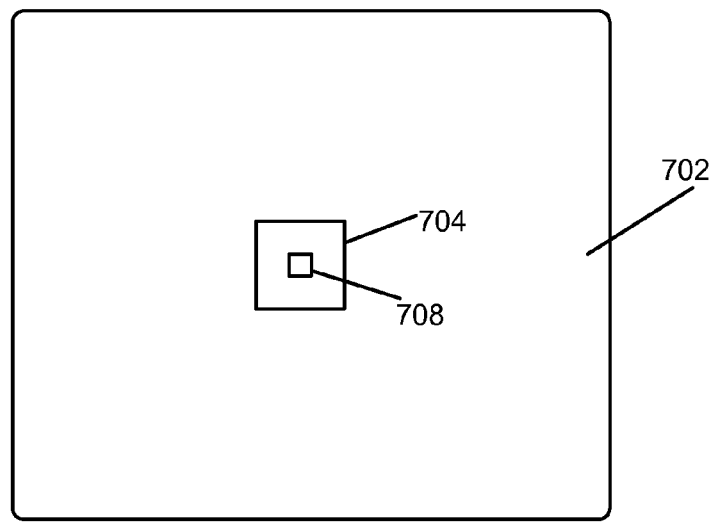
FIG. 7A is a top view of a leadframe in accordance with an embodiment of the present invention.
Figure 7B:
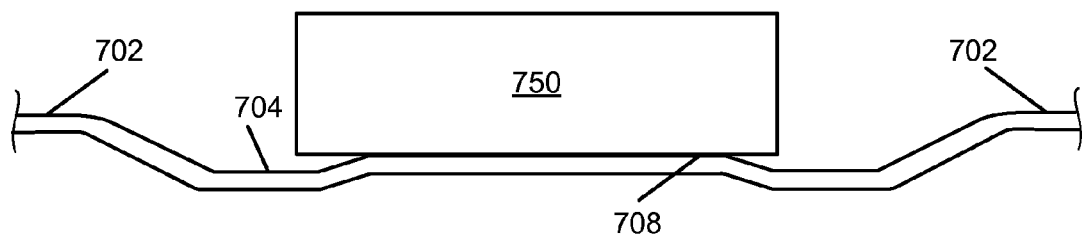
FIG. 7B is a cross-sectional view of a die and leadframe assembly in accordance with an embodiment of the present invention.

FIG. 3-5 discuss the leadframe designs in the context of the bow-tie configuration, a top view of which is shown in FIG. 3. However, the leadframes described herein are not limited to this particular configuration. FIG. 7A shows a top view of an example of a leadframe according to another embodiment, in which the main portion 702 surrounds recessed portion 704, including raised surface 708. FIG. 7B shows a cross-sectional view of the center of the leadframe including device 750. (A solder joint between the device and pad is not shown). Any of the above discussion regarding height differentials between the raised pad, the recessed portion and the main portion may be applied to this or any other leadframe discussed herein. While FIG. 7B shows only one side of the device contacting a leadframe, the opposite side may also be soldered, wire-bonded or otherwise joined to another leadframe.

Figure 8:
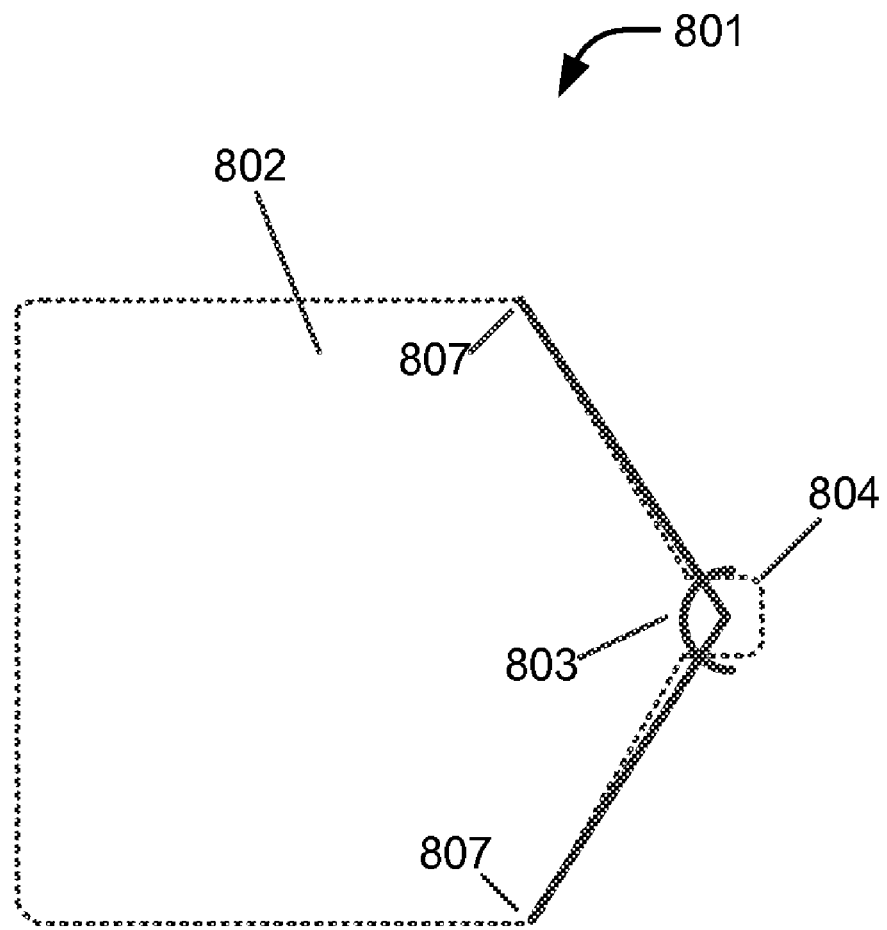
FIG. 8 illustrates a characterization of a leadframe design in accordance with an embodiment of the present invention.

One manner in which certain embodiments may be characterized is illustrated in FIG. 8, which shows a leadframe 801 (in dotted outline) for a front or back side of a device, including recessed portion 804 and main portion 802. An angle 803 is shown. Angle 803 is an angle having a vertex at the center of the recessed portion (or center of the raised pad), and rays extending to the nearest point at which the main portion is at its widest (indicated at 807). According to various embodiments, this angle may be greater than about 45°, greater than about 60°, greater than about 75°, greater than about 90°, greater than about 105°, greater than about 110°, greater than about 120°, greater than about 130°, greater than about 140°, greater than about 160°, or greater than about 170°. In certain embodiments, this angle may be greater than about 180°, or 270°. For example, for the leadframe depicted in FIG. 7A, the angle is 360°, as the leadframe extends all the way around the raised pad.

The angle described above and depicted in FIG. 8 provides an indication of the available area in the main portion for heat dissipation. For a bow-tie configuration as described above, this area doubled as heat is being transferred out of each side. For example, if front and back side leadframes have an angle of 140°, 280° of the 360° that surround the device is used for heat dissipation. Accordingly, in certain embodiments, for a bow-tie configuration, a total of at least about 200°, of at least about 220°, of at least about 240°, of at least about 260°, of at least about 280°, of at least about 300°, of at least about 320°, or of at least about 340° is provided for heat dissipation, as characterized as shown in FIG. 8.

Also according to various embodiments, differently shaped or sized leadframes, including leadframes having the same or differently shaped main portions, may be used for the front and back sides. Moreover while embodiments of the discussed above are for a two terminal device such as a diode, the leadframes described herein may also be used an electrical device with more than two terminals. A leadframe having multiple die support surfaces, e.g., either multiple raised die support surfaces or having at least one raised die support surface, may also be used with devices having co-planar terminals, or with multiple dies.

As described above, the leadframe and assemblies include a raised surface having a surface area smaller than that of the die, such that the edges of the die extend past the raised surface and the solder joint that joins the surface to the die. The distance the die extends past the solder joint is referred to as an edge exclusion distance. Examples of edge exclusion distances are about 0.003 to 0.020 inches, though other distances may be used as appropriate, e.g., at least about 0.001 inches.

The leadframes described herein are made of a conductive material, e.g., copper, and may be fabricated from one or multiple pieces of copper. In certain embodiments, the above-described contoured features of the leadframe, including the recessed portion and raised surface, may be formed by stamping or bending a metal piece appropriately.

Also provided are soldering processes for forming a solder joint between a die surface and leadframe such that the solder joint covers the majority of the die surface but does not extend to the edges of the die surface. According to various embodiments, during the soldering process, the alignment of parts is precisely controlled.

According to various embodiments, forming a solder joint between the raised surface and a device surface includes using an alignment pin, which is inserted in an alignment hole in the leadframe. A basket of a soldering jig engages the raised pad and a solder slug is placed on the pad. The solder slug may be selected from the group consisting of a solder perform and a solder paste. Any appropriate solder material may be used, with lead-free solder used in certain embodiments. The device is then placed on the solder slug with the appropriate side facing the solder slug. The device is then aligned in the basket with the alignment pin (inserted from above) such that the edges of the device extend past the slug and the edges of raised pad. Heat sufficient to melt the solder slug between the raised pad and the device surface is applied. The heat may be applied by a variety of means, for example, by use of an incident laser beam, by passing a current through the leadframes in contact with the device or by use of a soldering iron. The solder slug, the device and the leadframe are cooled to form a solder joint between the device surface and the raised surface of the leadframe, wherein the solder joint does not contact the edges of the device surface. The solder joint may also be formed without the use of an alignment pin.

In another embodiment, the solder paste or preform is applied. The leadframe is engaged on a fixture with vacuum and/or pins or another feature used for alignment. A vacuum may be applied to hold the die, e.g., with a vacuum pick head. Alternatively, a basket that engages the top and side of the die may be used to hold the die. Heat is applied to reflow the solder, which is cooled to form a solder joint. A solder slug or paste is then applied on the second side of the die, with the second leadframe positioned with a fixture, pins, vacuum, etc. Heat is then applied to reflow the second joint. In another embodiment, the solder may be reflowed a first time on the leadframe, the device then aligned, with the solder reflowed a second time to form the joint. In certain embodiments, both joints may be reflowed at the same time.

In certain embodiments, a preheat method is used to remove volatiles from the solder paste prior to forming the joint. In one example, solder paste is dispensed on one of the leadframes. Hot air is then used to flash off some of the volatiles in the paste flux. The diode is the positioned on top of the dot of paste, with a laser then used to reflow the paste. This is then repeated for the second leadframe and other side of the die. The hot air preheat is used to remove volatiles in the solder prior it is constrained in the narrow gap between the leadframe and die. If allowed to remain, the compounds will boil during the reflow and may blow the paste out of the joint. Volatile compounds may also be removed by a method in which two reflows are performed. In an example, solder paste is dispensed on both leadframes. A laser is used to reflow the dots of paste, either fully or partially. The diode is then positioned on top of dot of solder on one of the leadframes. A laser is used to reflow the solder. The other leadframe is then positioned on top of the other side of the diode. The solder between that leadframe and the diode is then reflowed with a laser.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. A contoured leadframe for a semiconductor device, comprising:
  a first portion comprising a raised surface and a recessed surface adjoining at least a portion of the raised surface; and
  a second portion adjoined to the first portion and comprising a first surface offset from and parallel to the recessed surface, wherein:
    the first portion and the second portion have a uniform thickness and form a shape with a three-dimensional contour,
    the recessed surface adjoins the raised surface along a first edge, a second edge, and a third edge of the raised surface,
    the recessed surface is substantially parallel to the raised surface,
    the second edge is disposed between the first edge and the third edge,
    the first edge and the third edge are substantially opposite each other,
    the recessed surface includes a fourth edge which substantially intersects the first edge and forms an acute angle with respect to the first edge, and
    the recessed surface includes a fifth edge which substantially intersects the third edge and forms an acute angle with respect to the third edge.

2. The contoured leadframe of claim 1, wherein the raised surface is configured to support a supported surface of a semiconductor device.

3. The contoured leadframe of claim 2, wherein the raised surface has an area smaller than that of the supported surface of a semiconductor device.

4. The contoured leadframe of claim 1, wherein the first surface is offset from and parallel to the raised surface.

5. The contoured leadframe of claim 1, wherein the recessed surface adjoins substantially the entire perimeter of the raised surface.

6. A semiconductor device assembly comprising:
  a first contoured leadframe, the first contoured leadframe comprising a first portion including a first raised surface and a first recessed surface adjoining the first raised surface and a second portion adjoined to the first portion and including a first offset surface offset from and parallel to the first recessed surface;
  a second contoured leadframe, the second contoured leadframe comprising a third portion including a second raised surface and a second recessed surface adjoining the second raised surface and a fourth portion adjoined to the third portion and including a second offset surface offset from and parallel to the second recessed surface; and
  a semiconductor device with a first side and an opposing second side, the first side attached via a first solder joint to the first raised surface, the second side attached via a second solder joint to the second raised surface, edges of the first raised surface offset from edges of the first side in directions parallel to the first side and not extending beyond the edges of the first side, and edges of the second raised surface offset from edges of the second side in directions parallel to the second side and not extending beyond the edges of the second side, wherein:
    the second portion is adjoined to the first portion at a plurality of sides of the first portion, and
    at least one side of the first portion is not adjoined to the second portion.

7. The assembly of claim 6, wherein:
  the first recessed surface adjoins the first raised surface along a first edge, a second edge, and a third edge of the first raised surface,
  the first recessed surface is substantially parallel to the first raised surface,
  the second edge is disposed between the first edge and the third edge,
  the first edge and the third edge are substantially opposite each other,
  the first recessed surface includes a fourth edge which substantially intersects the first edge and forms an acute angle with respect to the first edge, and
  the first recessed surface includes a fifth edge which substantially intersects the third edge and forms an acute angle with respect to the third edge.

8. The assembly of claim 6, wherein the first offset surface is offset from and parallel to the first raised surface.

9. The assembly of claim 6, wherein all of the edges of the semiconductor device extend past the first solder joint.

10. The assembly of claim 9, wherein at least one edge of the semiconductor device extends past the solder joint by at least 0.001 inches.

11. The assembly of claim 9, wherein the semiconductor device is a diode having a cathode side and an anode side.

12. The assembly of claim 11, wherein the cathode side of the semiconductor device is attached to the first raised surface.

13. The assembly of claim 11, wherein the anode side of the semiconductor device is attached to the first raised surface.

14. The assembly of claim wherein the first offset surface is offset from the first raised surface by at least 0.001 inches.

15. The contoured leadframe of claim 1, wherein the raised surface transitions to the recessed surface in a continuous manner along at least two non-parallel edges of the raised surface, thereby forming at least part of the three-dimensional contour.

16. A semiconductor device assembly comprising:
  a first contoured leadframe, the first contoured leadframe comprising a first portion including a first raised surface and a first recessed surface adjoining the first raised surface and a second portion adjoined to the first portion and including a first offset surface offset from and parallel to the first recessed surface, wherein:

the first portion and the second portion have a first uniform thickness, the first portion and the second portion form a first shape with a first three-dimensional contour, and the first raised surface transitions to the first recessed surface in a continuous manner along at least two non-parallel edges of the first raised surface, thereby forming at least part of the first three-dimensional contour;

a second contoured leadframe, the second contoured leadframe comprising a third portion including a second raised surface and a second recessed surface adjoining the second raised surface and a fourth portion adjoined to the third portion and including a second offset surface offset from and parallel to the second recessed surface, wherein:

the third portion and the fourth portion have a second uniform thickness, the third portion and the fourth portion form a second shape with a second three-dimensional contour, and the second raised surface transitions to the second recessed surface in a continuous manner along at least two non-parallel edges of the second raised surface, thereby forming at least part of the second three-dimensional contour; and a semiconductor device with a first side and an opposing second side, the first side attached via a first solder joint to the first raised surface, the second side attached via a second solder joint to the second raised surface, edges of the first raised surface offset from edges of the first side in directions parallel to the first side and not extending beyond the edges of the first side, and edges of the second raised surface offset from edges of the second side in directions parallel to the second side and not extending beyond the edges of the second side.

17. The assembly of claim 16, wherein all of the edges of the semiconductor device extend past the first solder joint.

18. The assembly of claim 17, wherein at least one edge of the semiconductor device extends past the solder joint by at least 0.001 inches.

19. The assembly of claim 16 wherein the first offset surface is offset from the first raised surface by at least 0.001 inches.

* * * * *

UNITED STATES PATENT AND TRADEMARK OFFICE
CERTIFICATE OF CORRECTION

PATENT NO. : 8,203,200 B2
APPLICATION NO. : 12/626281
DATED : June 19, 2012
INVENTOR(S) : Halstead et al.

It is certified that error appears in the above-identified patent and that said Letters Patent is hereby corrected as shown below:

IN THE CLAIMS:

In line 1 of claim 14 (column 12, line 54) change "The assembly of claim wherein …" to "The assembly of claim --6-- wherein …".

Signed and Sealed this
Seventh Day of October, 2014

Michelle K. Lee
*Deputy Director of the United States Patent and Trademark Office*